United States Patent
Naik et al.

(10) Patent No.: US 12,238,938 B1
(45) Date of Patent: Feb. 25, 2025

(54) RANDOM NUMBER GENERATORS INCLUDING MAGNETIC-TUNNEL-JUNCTION LAYER STACKS

(71) Applicant: GlobalFoundries Singapore Pte. Ltd., Singapore (SG)

(72) Inventors: Vinayak Bharat Naik, Singapore (SG); Jian Peng Chan, Singapore (SG); Seidikkurippu Nellainayagam Piramanayagam, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/655,453

(22) Filed: May 6, 2024

(51) Int. Cl.
  *H10B 61/00* (2023.01)
  *G06F 7/58* (2006.01)
  *H10N 50/10* (2023.01)

(52) U.S. Cl.
  CPC ............ *H10B 61/22* (2023.02); *G06F 7/588* (2013.01); *H10N 50/10* (2023.02)

(58) Field of Classification Search
  CPC ........ H10B 61/22; G06F 7/588; H10N 50/10; H10N 35/00; G11C 2211/5615; G11C 11/161; G11C 5/06–12; G11B 5/3909; G01R 33/09–098
  See application file for complete search history.

(56) References Cited

U.S. PATENT DOCUMENTS

| | | | |
|---|---|---|---|
| 9,859,018 B2 | 1/2018 | Ghosh et al. | |
| 2014/0071728 A1* | 3/2014 | Khalili Amiri | G11C 15/02 365/50 |
| 2019/0019538 A1* | 1/2019 | Li | G06N 3/049 |
| 2019/0190725 A1 | 6/2019 | De et al. | |
| 2020/0235289 A1 | 7/2020 | Alam et al. | |
| 2023/0089984 A1* | 3/2023 | Wu | H10B 61/00 257/421 |

OTHER PUBLICATIONS

J. Doevenspeck et al., "Multi-pillar SOT-MRAM for Accurate Analog in-Memory DNN Inference," 2021 Symposium on VLSI Technology, Kyoto, Japan, 2021, pp. 1-2.

* cited by examiner

*Primary Examiner* — Shahed Ahmed
(74) *Attorney, Agent, or Firm* — Thompson Hine LLP

(57) ABSTRACT

Structures for a random number generator that include magnetic-tunnel-junction layer stacks and methods of forming such structures. The structure comprises a write line, first and source lines, a first transistor connected by the first source line to a first end of the write line, and a second transistor connected by the second source line to a second end of the write line. The structure further comprises a plurality of magnetic-tunneling-junction layer stacks disposed on the write line between the first and second ends of the write line.

20 Claims, 3 Drawing Sheets

RANDOM NUMBER GENERATORS INCLUDING MAGNETIC-TUNNEL-JUNCTION LAYER STACKS

BACKGROUND

The present disclosure relates to integrated circuits and semiconductor device fabrication and, more specifically, to structures for a random number generator that include magnetic-tunnel-junction layer stacks and methods of forming such structures.

Random number generators are used in multiple applications, such as cryptography and hardware security, to generate random sequences. Conventional random number generators may operate based on physically random phenomena, such as randomness through sources such as thermal noise or jitter in complementary metal-oxide-semiconductor devices. However, conventional random number generators tend to be complex and power consuming.

A magnetic-tunneling-junction layer stack may include a pinned or fixed layer, a free layer, and a tunnel barrier layer arranged between the fixed layer and the free layer. The magnetization of the fixed layer is static in its magnetic orientation, and the magnetization of the free layer is dynamic in its magnetic orientation relative to the fixed layer. Specifically, the magnetization of the free layer may be switched relative to the fixed layer by a spin-orbit torque to provide either a low-resistance state across the magnetic-tunneling-junction layer stack or a high-resistance state across the magnetic-tunneling-junction layer stack.

Improved structures for a random number generator that include magnetic-tunnel-junction layer stacks and methods of forming such structures are needed.

SUMMARY

According to an embodiment of the invention, a structure for a random number generator is provided. The structure comprises a write line, a first source line, a second source line, a first transistor connected by the first source line to a first end of the write line, and a second transistor connected by the second source line to a second end of the write line. The structure further comprises a plurality of magnetic-tunneling-junction layer stacks disposed on the write line between the first and second ends of the write line.

According to an embodiment of the invention, a method of forming a structure for a random number generator is provided. The method comprises forming a write line, forming a first transistor connected by a first source line to a first end of the write line, and forming a second transistor connected by a second source line to a second end of the write line. The method further comprises forming a plurality of magnetic-tunneling-junction layer stacks disposed on the write line between the first and second ends of the write line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
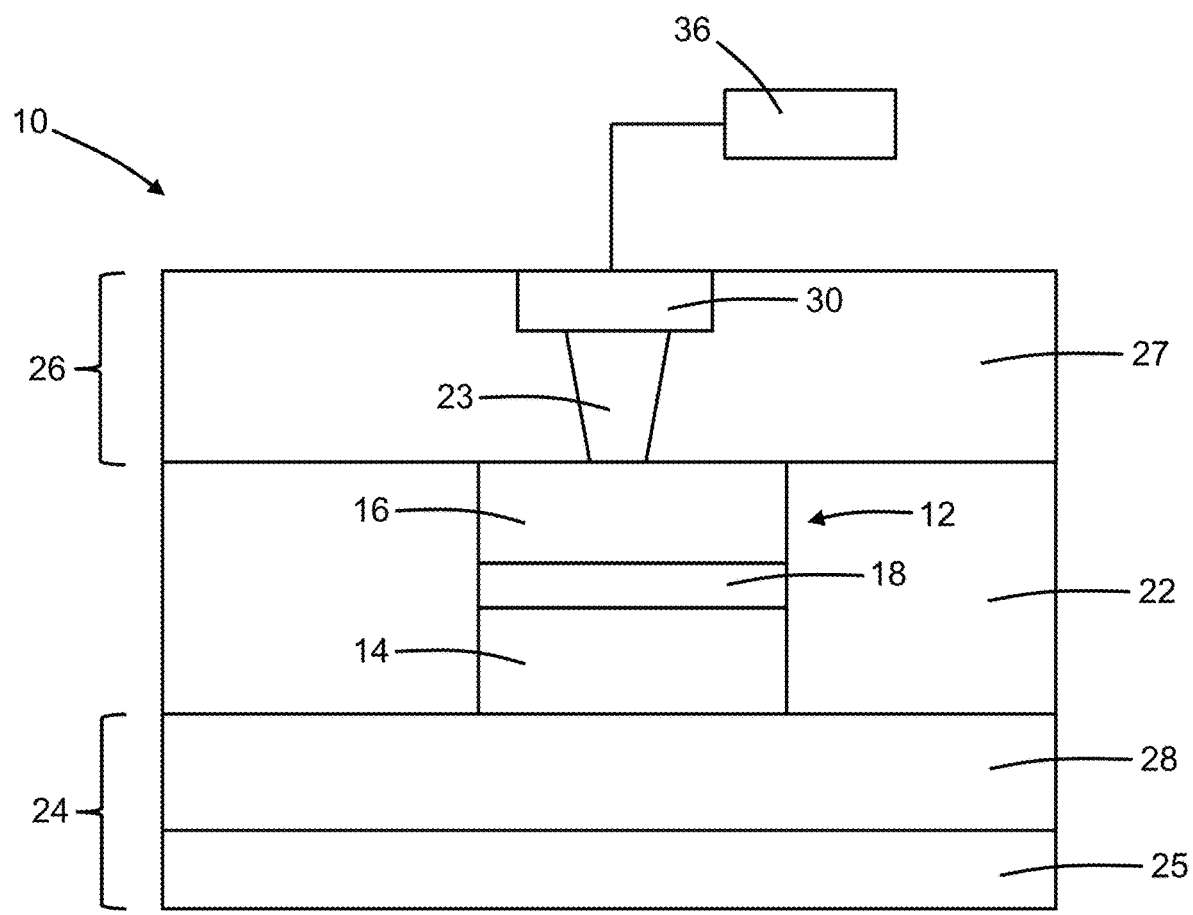
FIG. 1 is a cross-sectional view of a structure for use in a random number generator that includes a magnetic-tunnel-junction layer stack in accordance with embodiments of the invention.

With reference to FIG. 1 and in accordance with embodiments of the invention, a structure 10 for use in a random number generator may include a magnetic-tunneling-junction layer stack 12. The magnetic-tunneling-junction layer stack 12 may include a free layer 14, a reference layer 16, and a tunnel barrier layer 18 that is disposed between the free layer 14 and the reference layer 16. The layers 14, 16, 18 of the magnetic-tunneling-junction layer stack 12 may be sequentially formed with a stacked arrangement by one or more deposition processes, such as physical vapor deposition processes, and then patterned by one or more lithography and etching processes.

The magnetic-tunneling-junction layer stack 12 may be located in a dielectric layer 22 that is disposed between a wiring level 24 and a wiring level 26 of an interconnect structure. The wiring levels 24, 26 of the interconnect structure may be individually formed by deposition, polishing, lithography, and etching techniques. The wiring level 24 may include one or more dielectric layers 25 and a write line 28 that is formed as a track in the one or more dielectric layers 25, and the wiring level 26 may include a via 23 and an interconnect 30 that are formed in one or more dielectric layers 27. Each of the dielectric layers 22, 25, 27 may be comprised of a dielectric material, such as silicon dioxide, that is an electrical insulator, the write line 28 may be comprised of a non-magnetic metal, such as tungsten, and the via 23 and interconnect 30 may be comprised of a metal, such as copper or aluminum.

The free layer 14 of the magnetic-tunneling-junction layer stack 12 may be disposed on an underlying portion of the write line 28. In an embodiment, the free layer 14 of the magnetic-tunneling-junction layer stack 12 may be disposed directly on, and in direct contact with, the underlying portion of the write line 28. The tunnel barrier layer 18 may be disposed on the free layer 14. In an embodiment, the tunnel barrier layer 18 may be disposed directly on the free layer 14. The reference layer 16 may be disposed on the tunnel barrier layer 18 and connected by the via 23 to the interconnect 30. In an embodiment, the reference layer 16 may be disposed directly on the tunnel barrier layer 18.

The free layer 14 may be comprised of a ferromagnetic material, such as a cobalt-iron-boron alloy. The reference layer 16 may also be comprised of a ferromagnetic material, such as a cobalt-iron-boron alloy. The tunnel barrier layer 18 may be comprised of a non-magnetic dielectric material, such as magnesium oxide, that is an electrical insulator.

The magnetic-tunneling-junction layer stack 12 may be configured as a three-terminal structure that operates under a spin-orbit transfer mechanism. A current flowing in the write line 28 parallel to the planes of the free layer 14, reference layer 16, and tunnel barrier layer 18 can transfer spin-orbit torque to the magnetic-tunneling-junction layer stack 12. The free layer 14 and the reference layer 16 are configured to have different responses to the transferred spin-orbit torque. The magnetization of the reference layer 16 is pinned or fixed and cannot switch under the influence of the transferred spin-orbit torque. The magnetization of the free layer 14 can switch under the influence of the transferred spin-orbit torque to be aligned either parallel or substantially parallel to the magnetization of the reference layer 16 or to be aligned either antiparallel or substantially antiparallel to the magnetization of the reference layer 16. Parallel or substantially parallel alignment produces a low-resistance state across the magnetic-tunneling-junction layer stack 12. Antiparallel alignment or substantially antiparallel alignment produces a high-resistance state across the magnetic-tunneling-junction layer stack 12. The high-resistance state is characterized by an electrical resistance that is greater than the electrical resistance in the low-resistance state. The different electrical resistance states are separated by an energy barrier for switching that must be overcome for switching to occur and that may supply a metastable condition for the different electrical resistance states.

The interconnect 30 may function as a bit line that is coupled to sensing circuitry 36. The sensing circuitry 36 may be operated to query and read the resistance state of the magnetic-tunneling-junction layer stack 12. In response to a query, an output current from the magnetic-tunneling-junction layer stack 12 may be sensed by the sensing circuitry 36 and then used by the sensing circuitry 36 to determine whether the magnetic-tunneling-junction layer stack 12 is in its high-resistance state or in its low-resistance state.

In use, the orientation of the magnetization of the free layer 14 is responsive to the application of a current flowing in the write line 28 that transfers spin-orbit torque transferred to the free layer 14. Current does not flow from the write line 28 through the magnetic-tunneling-junction layer stack 12 to the interconnect 30. The randomness of the magnetic-tunneling-junction layer stack 12 in the three-terminal structure is determined by the non-deterministic nature of switching between the high-resistance state and low-resistance states resulting from the metastable condition, which generates random bit flipping between the different logical values (e.g., a logical "0" or a logical "1").

Figure 2:
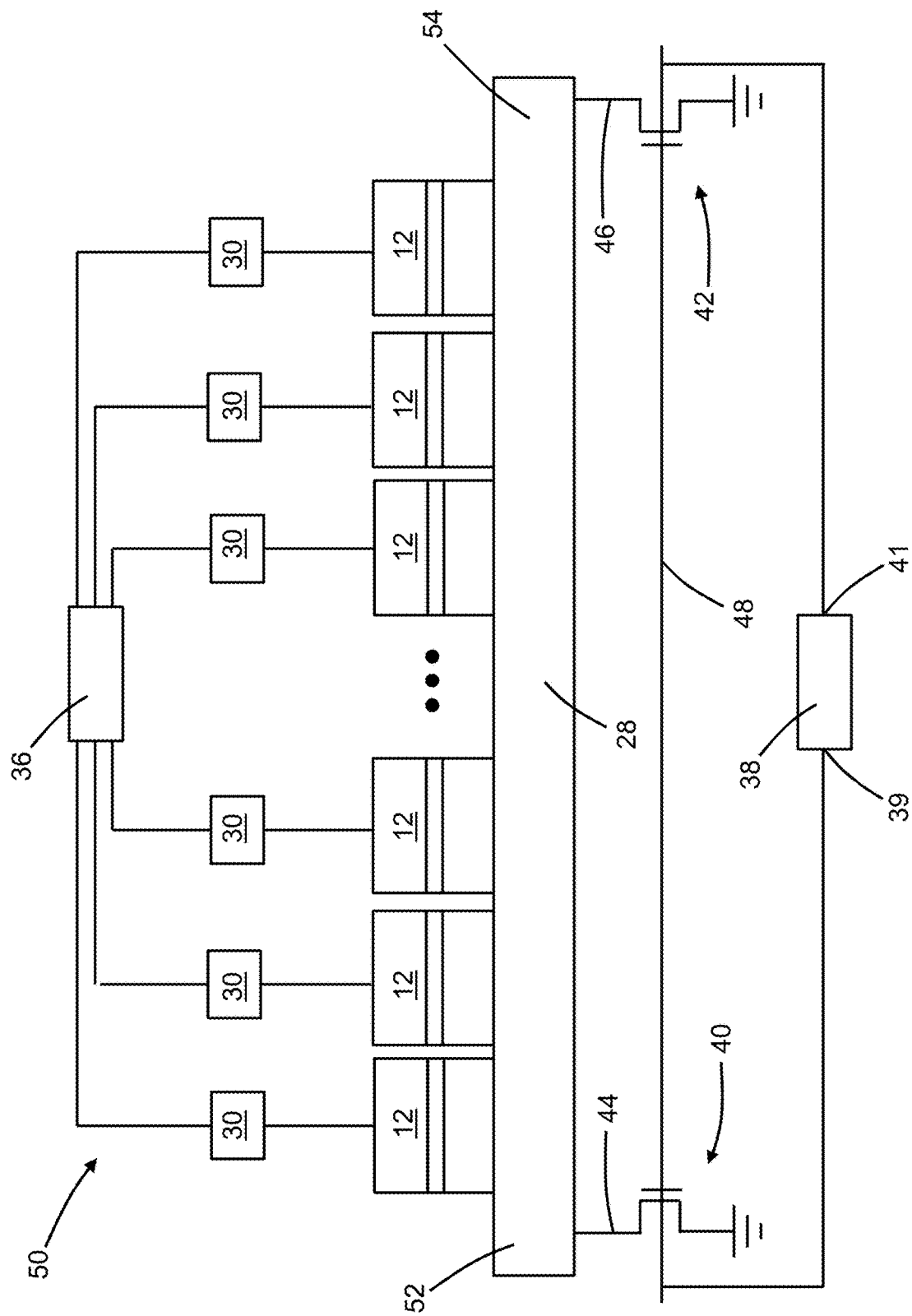
FIG. 2 is a diagrammatic view of a structure for a random number generator that includes multiple magnetic-tunnel-junction layer stacks in accordance with embodiments of the invention.

With reference to FIG. 2 and in accordance with embodiments of the invention, a structure 50 for a random number generator may include multiple instances of the magnetic-tunneling-junction layer stack 12 that are disposed on the write line 28 between an end 52 of the write line 28 and an opposite end 54 of the write line 28. The instances of the magnetic-tunneling-junction layer stack 12 are replicated and arranged with a spaced and disconnected relationship on the write line 28. Specifically, the free layer 14 of each instance of the magnetic-tunneling-junction layer stack 12 is disposed on a dedicated portion of the write line 28 having an area equal to the area of the free layer 14. In an embodiment, the instances of the magnetic-tunneling-junction layer stack 12 may be disposed in a row on the write line 28 between the opposite ends 52, 54 of the write line 28. In an embodiment, the free layer 14 of each instance of the magnetic-tunneling-junction layer stack 12 may be disposed directly on, and in direct contact with, the underlying portion of the write line 28.

The write line 28 is configured to carry a current that concurrently supplies a spin-orbit torque to all instances of the magnetic-tunneling-junction layer stack 12 disposed on the write line 28. Each instance of the magnetic-tunneling-junction layer stack 12 is connected to a dedicated interconnect 30, which serves as an independent bit line dedicated to each instance of the magnetic-tunneling-junction layer stack 12. Each instance of the magnetic-tunneling-junction layer stack 12 has a state of electrical resistance that can be independently queried and read by the sensing circuitry 36. Specifically, an output current from each magnetic-tunneling-junction layer stack 12 can be sensed by the sensing circuitry 36 and used to determine whether each of the magnetic-tunneling-junction layer stacks 12 is characterized by its high-resistance state or in its low-resistance state, which represent different logical values (e.g., a logical "0" or a logical "1") for individual bits of binary information that can be used to generate a portion of a random number.

A transistor 40 may be coupled to the end 52 of the write line 28, and a transistor 42 may be coupled to the opposite end 54 of the write line 28. The transistor 40 may include a source connected by a source line 44 to the end 52 the write line 28, a drain coupled to ground, and a gate structure including a gate electrode and a gate dielectric. The transistor 42 may include a source connected by a source line 46 to the end 54 of the write line 28, a drain coupled to ground, and a gate structure including a gate electrode and a gate dielectric. The transistors 40, 42 may be formed by front-end-of-line processing of a substrate, such as a silicon-on-insulator substrate or a bulk semiconductor substrate. The gate electrode may be comprised of a gate conductor, such as doped polycrystalline silicon (i.e., polysilicon) or one or more work-function metals, and the gate dielectric comprised of an electrical insulator, such as silicon dioxide or a high-k dielectric material. The source and drain may be comprised of doped semiconductor material, such as doped silicon or doped silicon-germanium, that is formed in and/or on the substrate.

A shared word line 48 may be connected to the gate electrode of the transistor 40 and to the gate electrode of the transistor 42. The shared word line 48 may be used to switch the transistors 40, 42 by supplying a control voltage to their gate electrodes and cause a current to be selectively supplied to the write line 28.

The instances of the magnetic-tunneling-junction layer stack 12 are electrically and physically connected to the dedicated portions of the write line 28 at positions that are positioned between the portion of the write line 28 coupled to source line 44 and the portion of the write line 28 coupled to the source line 46. The write line 28 is continuous and uninterrupted between the connection to the source line 44 and the connection to the source line 46.

Each instance of the magnetic-tunneling-junction layer stack 12 may represent a bit of binary information corresponding to one or the other of the different logical values that can be used to generate a random number having multiple bits of binary information. The number of bits of binary information generated by the structure 50 is proportional to the number of instances of the magnetic-tunneling-junction layer stack 12. In an embodiment, three or more instances of the magnetic-tunneling-junction layer stack 12 and, more specifically, their free layers 14 may be disposed on, and physically and electrically connected to, dedicated portions (i.e., areas) of the write line 28 at positions that are disposed between the portion of the write line 28 coupled to the source line 44 and the portion of the write line 28 coupled to the source line 46. In an embodiment, sixty-four (64) instances of the magnetic-tunneling-junction layer stack 12 and, more specifically, their free layers 14 may be disposed on, and physically and electrically connected to, dedicated portions (i.e., areas) of the write line 28 at positions that are disposed between the portion of the write line 28 coupled to the source line 44 and the portion of the write line 28 coupled to the source line 46. In an embodiment, one hundred twenty-eight (128) instances of the magnetic-tunneling-junction layer stack 12 and, more specifically, their free layers 14 may be disposed on, physically and electrically connected to, dedicated portions (i.e., areas) of the write line 28 at positions that are disposed between the portion of the write line 28 coupled to the source line 44 and the portion of the write line 28 coupled to the source line 46.

The word line 48 may be coupled to a power supply 38, which may be integrated into driving circuitry for the random number generator. The power supply 38 may include a terminal 39 coupled through the transistor 40 to the end 52 of the word line 48 and a terminal 41 coupled through the transistor 42 to the end 54 of the word line 48. The power supply 38 may be configured to direct a write current to the write line 28 via the source lines 44, 46 and the switching provided by transistors 40, 42 in a write operation that concurrently transfers spin-orbit torque to the different instances of the magnetic-tunneling-junction layer stack 12 for changing the magnetization of the free layer 14. The pair of transistors 40, 42 is configured to drive all of the different instances of the magnetic-tunneling-junction layer stack 12 on the write line 28, which enables a high density of the instances of the magnetic-tunneling-junction layer stack 12 and enables operation with a low power consumption compared to other types of random number generators. The resistance states of the instances of the magnetic-tunneling-junction layer stack 12 are not individually controlled but are instead controlled collectively and as a group by the switching of the pair of transistors 40, 42.

The randomness of each instance of the magnetic-tunneling-junction layer stack 12 is determined by the non-deterministic nature of switching inherent to the three-terminal structure, which generates random bits of binary information in response to the transferred spin-orbit torque. Variations in the coercivity (Hc) and/or variations in the critical dimension of the different instances of the magnetic-tunneling-junction layer stack 12 provide the non-deterministic switching for the random number generator. For example, the instances of the magnetic-tunneling-junction layer stack 12 may have different individual coercivities within a range of 4000 oersteds to 5000 oersteds. The variations in the coercivity and/or critical dimension may result from process variations experienced when fabricating the instances of the magnetic-tunneling-junction layer stack 12. Following a write operation using the spin-orbit torque transferred from the current in the word line 48 and after the current is removed, the magnetization of each instance of the magnetic-tunneling-junction layer stack 12 has substantially equal probability of settling with an alignment parallel or substantially parallel to the magnetization of the reference layer 16 or alignment antiparallel or substantially antiparallel to the magnetization of the reference layer 16.

Figure 3:
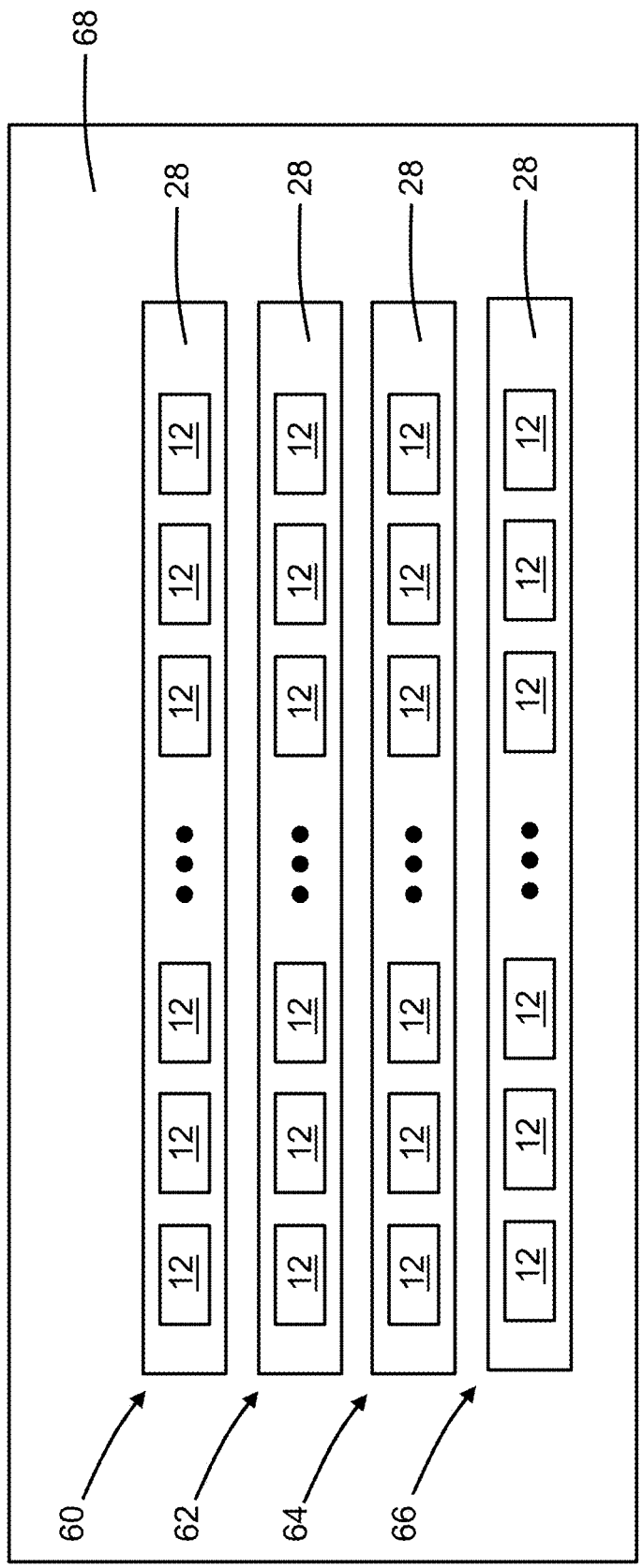
FIG. 3 is a diagrammatic view of a structure for a random number generator that includes multiple magnetic-tunnel-junction layer stacks in accordance with embodiments of the invention.

With reference to FIG. 3 and in accordance with embodiments of the invention, multiple instances 60, 62, 64, 66 of the structure 50 (FIG. 2) may be disposed on a single chip 68. The multiple instances 60, 62, 64, 66 of the structure 50 may be used, for example, to generate multiple random numbers or a single random number of high complexity. The magnetic-tunneling-junction layer stacks 12 included in each of the instances 60, 62, 64, 66 of the structure 50 are disposed on a dedicated instance of the write line 28, and the magnetic-tunneling-junction layer stacks 12 included in each of the instances 60, 62, 64, 66 of the structure 50 may independently receive spin-orbit torque to enable the generation of a single random number or to enable the generation of a portion of a complex random number.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a random number generator, the structure comprising:
   a first write line having a first end and a second end;
   a first source line;
   a second source line;
   a first transistor connected by the first source line to the first end of the first write line;
   a second transistor connected by the second source line to the second end of the first write line; and a first plurality of magnetic-tunneling-junction layer stacks disposed on the first write line between the first end of the first write line and the second end of the first write line,
wherein the first write line is continuous between the first end and the second end.

2. The structure of claim 1 further comprising:
a plurality of bit lines,
wherein the first plurality of magnetic-tunneling-junction layer stacks are individually connected to one of the plurality of bit lines.

3. The structure of claim 1 further comprising:
a plurality of bit lines,
wherein each of the first plurality of magnetic-tunneling-junction layer stacks includes a free layer disposed on the write line, a reference layer connected to one of the plurality of bit lines, and a tunnel barrier layer disposed between the free layer and the reference layer, and each of the first plurality of magnetic-tunneling-junction layer stacks is configured to have a resistance state determined in response to receiving a spin-orbit torque.

4. The structure of claim 3, wherein the free layer of each of the first plurality of magnetic-tunneling-junction layer stacks is disposed directly on the write line.

5. The structure of claim 1, wherein each of the first plurality of magnetic-tunneling-junction layer stacks includes a free layer disposed on the write line.

6. The structure of claim 1, wherein each of the first plurality of magnetic-tunneling-junction layer stacks includes a free layer disposed directly on the write line.

7. The structure of claim 1, wherein the first transistor and the second transistor are the only transistors coupled to the first write line.

8. The structure of claim 1, wherein the first plurality of magnetic-tunneling-junction layer stacks on the first write line total to sixty-four in number.

9. The structure of claim 1, wherein the first plurality of magnetic-tunneling-junction layer stacks on the first write line total to one-hundred twenty-eight in number.

10. The structure of claim 1, wherein the first plurality of magnetic-tunneling-junction layer stacks on the first write line total to three or more in number.

11. The structure of claim 1, wherein the first plurality of magnetic-tunneling-junction layer stacks are disposed with a spaced relationship on the first write line.

12. The structure of claim 1 further comprising:
a power supply including a first terminal connected by the first source line to the first end of the first write line and a second terminal connected by the second source line to the second end of the first write line.

13. A structure for a random number generator, the structure comprising:
a first write line having a first end and a second end;
a first source line;
a second source line;
a first transistor connected by the first source line to the first end of the first write line;
a second transistor connected by the second source line to the second end of the first write line;
a first plurality of magnetic-tunneling-junction layer stacks disposed on the first write line between the first end of the first write line and the second end of the first write line;
a second write line having a first end and a second end; and
a second plurality of magnetic-tunneling-junction layer stacks disposed on the second write line between the first end and the second end of the second write line,
wherein the first write line, the second write line, the first plurality of magnetic-tunneling-junction layer stacks, and the second plurality of magnetic-tunneling-junction layer stacks are disposed on a chip.

14. The structure of claim 13 further comprising:
a third source line;
a fourth source line;
a third transistor connected by the third source line to the first end of the second write line; and
a fourth transistor connected by the fourth source line to the second end of the second write line.

15. The structure of claim 13, wherein each of the first plurality of magnetic-tunneling-junction layer stacks includes a free layer disposed on the first write line, and each of the second plurality of magnetic-tunneling-junction layer stacks includes a free layer disposed on the second write line.

16. The structure of claim 13 wherein the first write line is continuous between the first end of the first write line and the second end of the first write line, and the second write line is continuous between the first end of the second write line and the second end of the second write line.

17. A structure for a random number generator, the structure comprising:
a first write line having a first end and a second end;
a first source line;
a second source line;
a first transistor connected by the first source line to the first end of the first write line;
a second transistor connected by the second source line to the second end of the first write line;
a first plurality of magnetic-tunneling-junction layer stacks disposed on the first write line between the first end of the first write line and the second end of the first write line; and
a power supply including a first terminal connected by the first source line to the first end of the first write line and a second terminal connected by the second source line to the second end of the first write line.

18. The structure of claim 17, wherein the power supply is configured to supply a current to the first write line.

19. The structure of claim 18, wherein the first plurality of magnetic-tunneling-junction layer stacks is configured to receive spin-orbit torque from the current supplied by the power supply to the first write line.

20. The structure of claim 17, wherein the first write line is continuous between the first end and the second end.

* * * * *